(12) United States Patent
Ramirez

(10) Patent No.: US 7,986,195 B2
(45) Date of Patent: Jul. 26, 2011

(54) DIGITAL FM MODULATOR

(75) Inventor: Sergio R. Ramirez, Austin, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 109 days.

(21) Appl. No.: 12/036,377

(22) Filed: Feb. 25, 2008

(65) Prior Publication Data
US 2008/0204159 A1    Aug. 28, 2008

Related U.S. Application Data

(60) Provisional application No. 60/903,609, filed on Feb. 26, 2007.

(51) Int. Cl.
*H03C 3/00*    (2006.01)

(52) U.S. Cl. ........ 332/119; 332/100; 332/117; 332/120; 455/42; 455/110

(58) Field of Classification Search ............... 332/100, 332/103, 117, 119, 120; 375/271, 300; 455/42, 455/100
See application file for complete search history.

(56) References Cited

U.S. PATENT DOCUMENTS

| | | | | |
|---|---|---|---|---|
| 5,091,705 A | * | 2/1992 | Hiramatsu et al. | 332/103 |
| 5,121,412 A | * | 6/1992 | Borth | 375/308 |
| 5,905,413 A | * | 5/1999 | Yoshida et al. | 332/100 |

* cited by examiner

*Primary Examiner* — Joseph Chang
*Assistant Examiner* — Jeffrey Shin
(74) *Attorney, Agent, or Firm* — Banner & Witcoff, Ltd.

(57) ABSTRACT

Provided are apparatuses and methods for digital FM modulation. In one example, a message signal is integrated by an integrator to transform the message signal into a complex signal. The complex signal may include at least two complex components that may interfere to produce an FM modulated carrier signal. Hence, in this example, the method and apparatus for digital FM modulation may produce an FM modulated carrier signal without phase shifting. In another example, a lookup table is not necessary for modulation of the carrier signal.

21 Claims, 3 Drawing Sheets

DIGITAL FM MODULATOR

CROSS-REFERENCE TO RELATED APPLICATIONS

This application claims priority to provisional application 60/903,609, filed Feb. 26, 2007, and having the same title, herein incorporated by reference.

FIELD OF THE INVENTION

The invention relates generally to a digital FM modulator. More specifically, the invention relates to FM modulation with signal decomposition.

BACKGROUND OF THE INVENTION

Digital FM modulators may be used for transmitting signals over a frequency modulated (FM) wave. In FM modulation, the frequency of a carrier wave varies in a continuous manner based on an analog message signal. In digital modulation, changes in the message signal include integration of the message signal followed by phase shifting of the message signal. In phase shifting of the signal in a digital FM modulator, values are chosen from a list of entries in a lookup table that conveys a different possible symbol or piece of information.

Thus, in FM modulation, a frequency of a carrier signal is varied by adding a time varying component such that the frequency may be the unmodulated carrier frequency plus a deviation from the carrier frequency with respect to the input message signal.

Typically in FM modulation, a message signal is integrated, then the integrated message signal is used to phase shift the carrier to modulate the signal. However, efficient implementation of phase shifting of the integrated message signal may be problematic in digital signal processing hardware. Also, phase shifting of the integrated message signal may be time and power consuming. For example, an input signal is received and processed and the processed input signal is then matched on a table of entries in a lookup table for phase shifting. A corresponding lookup table entry is selected to obtain the phase-shifted FM modulated signal.

FIG. 1 illustrates a typical modulator. A message signal may be integrated by an integrator 101. The output of the integrator 101 provides an integrated message signal which is used to phase shift the carrier in the phase shifter 102 and modulator 103 to result in the output modulated signal. However, phase shifting of the message signal may be both time consuming and costly as a lookup table is used to obtain the FM modulated signal. Therefore, a need exists for FM modulation in an efficient manner such that a message signal may be computed in digital signal processing hardware in a power and time-saving manner.

BRIEF SUMMARY OF THE INVENTION

The following presents a simplified summary in order to provide a basic understanding of some aspects of the invention. The summary is not an extensive overview of the invention. It is neither intended to identify key or critical elements of the invention nor to delineate the scope of the invention. The following summary merely presents some concepts of the invention in a simplified form as a prelude to the more detailed description below.

In one example, a method is provided for modulating a carrier signal in FM modulation. In one example, a message signal may be integrated and decomposed into a complex signal. The complex signal may be modulated, for example, with at least two AM modulators operating in quadrature.

In another example, a digital FM modulator is provided including an integrator for integrating a message signal and a decomposing unit for decomposing the integrated message signal into a complex signal. The complex signal may comprise at least two complex components (e.g., a sine and a cosine component). In one example, the at least two complex components may interfere to produce a modulated signal.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF THE INVENTION

Figure 1:
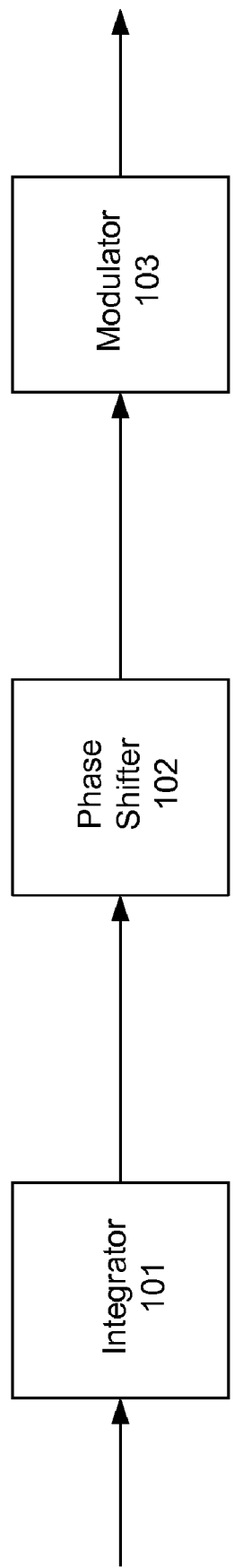
FIG. 1 illustrates a typical digital FM modulator.

In the following description of the various embodiments, reference is made to the accompanying drawings, which form a part hereof, and in which is shown by way of illustration various embodiments in which the invention may be practiced. It is to be understood that other embodiments may be utilized and structural and functional modifications may be made without departing from the scope and spirit of the present invention.

In FM modulation, a bit stream of data is modulated for transmission based on the frequency of a carrier wave. Modulation of the data facilitates transfer of the information over a transmission medium. In frequency modulation, the frequency of a carrier wave is adjusted based on the transmitted signal. When the signal is high, the frequency of the carrier wave is increased. Conversely, when the signal is low, the frequency of the carrier wave may be decreased.

The carrier may be expressed as follows:

$$C_m(t) = A\cos(\omega t + \Phi(t))$$

In which $\Phi(t)$ represents the phase and may be written as:

$$\Phi(t) = K\int_{-\infty}^{t} f(t)dt$$

Where f(t) represents the frequency of the carrier response to a message signal. In one example, the range of f(t) may vary in the interval [−A, A], where A represents the amplitude of the message signal. The range of the phase $\Phi(t)$ may range in the interval [−π,π], for example. Also, f(t) may vary by adding a time varying component to the carrier frequency. For example, the carrier frequency may be provided as follows:

$$f(t) = f_c + K*m(t)$$

Where $f_c$ is the frequency of the unmodulated carrier, K is a scaling factor and m(t) is the message signal. K*m(t) represents the deviation from the carrier frequency based on the message signal in this example.

Typically, an FM modulator integrates the message signal prior to modulating the signal such that the integrated signal is used in place of the phase. For example, the carrier may be expressed as follows:

$$s(t) = A_c \cos\left(2\pi f_c t + 2\pi k_f \int_{-\infty}^{t} m(t) dt\right)$$

As the above illustrates, the message signal is first integrated and then used in place of the phase for phase shifting and modulating.

In an example of one aspect of the invention, the integrated message signal is decomposed to provide a complex signal for modulation. Thus, in this example, phase shifting of the signal is not needed. One additional advantage is that lookup tables are also not necessary.

In one example, the carrier signal may be represented as a cosine signal. For example, the carrier signal may be expressed as follows:

$$C(t) = A \cos(\omega t)$$

The carrier signal may be FM modulated with a phase shift of $\Phi(t)$ as a function of the message signal as follows.

$$C_m(t) = A \cos(\omega t + \Phi(t))$$

In which the argument is an angle and includes the phase of the message signal. The frequency of the input message signal may be related to the phase $\Phi(t)$ as follows:

$$\Phi(t) = K \int_{-\infty}^{t} f(t) dt$$

The function $f(t)$ may vary within a range given by the amplitude of the message signal. For example, if the amplitude of the message signal is $[-A, A]$, then the range of $f(t)$ may range in the interval $[-A, A]$. In this example, the range of $\Phi(t)$ may be in the range of $[-\pi, \pi]$.

The modulated carrier signal may be further translated into the discrete time domain and expressed in terms of the ratio between the oscillator frequency and the sample rate of the digital modulator. For example, if the ratio between the oscillator frequency and the sample rate of the digital modulator is expressed as $\theta$ and the number of samples is given as n, then the modulated signal at sample n translated into the discrete time domain may be expressed as follows:

$$C_m(n) = A \cos [n\theta + \Phi(n)]$$

Similarly, the modulated signal at sample (n+1) translated into the discrete time domain may be expressed as follows:

$$C_m(n+1) = A \cos [(n+1)\theta + \Phi(n+1)]$$

Expanding the above equation using the general known identity for $\cos(A+B) = \cos A \cos B - \sin A \sin B$, the modulated signal at sample (n+1) translated into the discrete time domain may be further expressed as follows:

$$C_m(n+1) = A \{ \cos [(n+1)\theta] \cos \Phi(n+1) - \sin [(n+1)\theta] \sin \Phi(n+1) \}$$

As the above illustrates, the message signal is integrated, then decomposed into a complex signal comprising cosine and sine components. Modulation of the signal is accomplished on the complex signal and phase shifting is not necessary.

In one example, functions representing the modulated carrier signal may be implemented in a digital oscillator. For example, the function $\cos [(n+1)\theta]$ may be expressed as a function of signal sample and the ratio between the oscillator frequency and the sample rate of the digital modulator (represented as $\theta$) by a digital oscillator as follows:

$$\cos [(n+1)\theta] = 2 \cos \theta \cos(n\theta) - \cos [(n-1)\theta]$$

Similarly, the function $\sin [(n+1)\theta]$ may be expressed by a digital oscillator as follows:

$$\sin [(n+1)\theta] = 2 \cos \theta \sin(n\theta) - \sin [(n-1)\theta]$$

Additionally, components of the modulation of the signal may be provided by a function generator. For example, $\cos \Phi(n+1)$ may be expressed by a cosine function generator and $\sin \Phi(n+1)$ may be implemented by a sine function generator.

Figure 2:
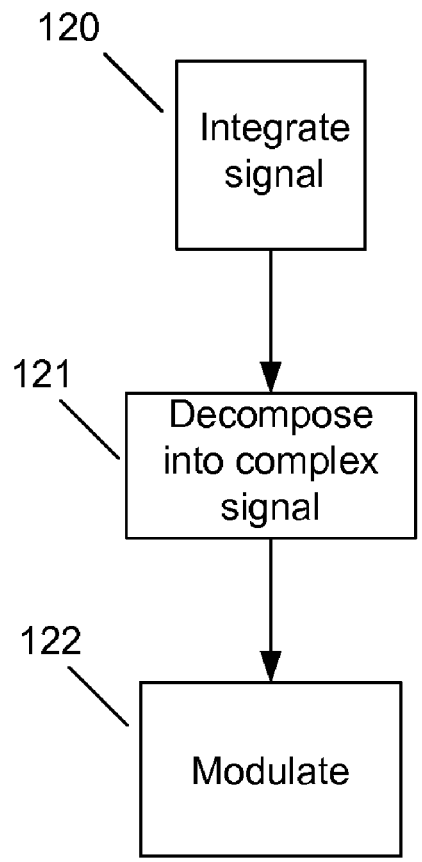
FIG. 2 illustrates an example of a method for determining a modulated carrier signal in a digital FM modulator in accordance with an aspect of one embodiment.

FIG. 2 illustrates an example of a method for digital FM modulation. In this example, a modulating carrier signal is received (STEP 120). The modulating carrier signal may be processed, for example, by in integrator, and decomposed into a complex signal. For example, the integrated signal may be decomposed into cosine and sine components to produce the least one complex signal (STEP 121). The complex signal may be modulated (STEP 122) without the need for phase shifting. For example, the complex components of the signal, such as a cosine component and a sine component, may interfere with each other to produce an FM modulated signal. As illustrated in the example of FIG. 2, no lookup table is necessary in modulation.

Figure 3:
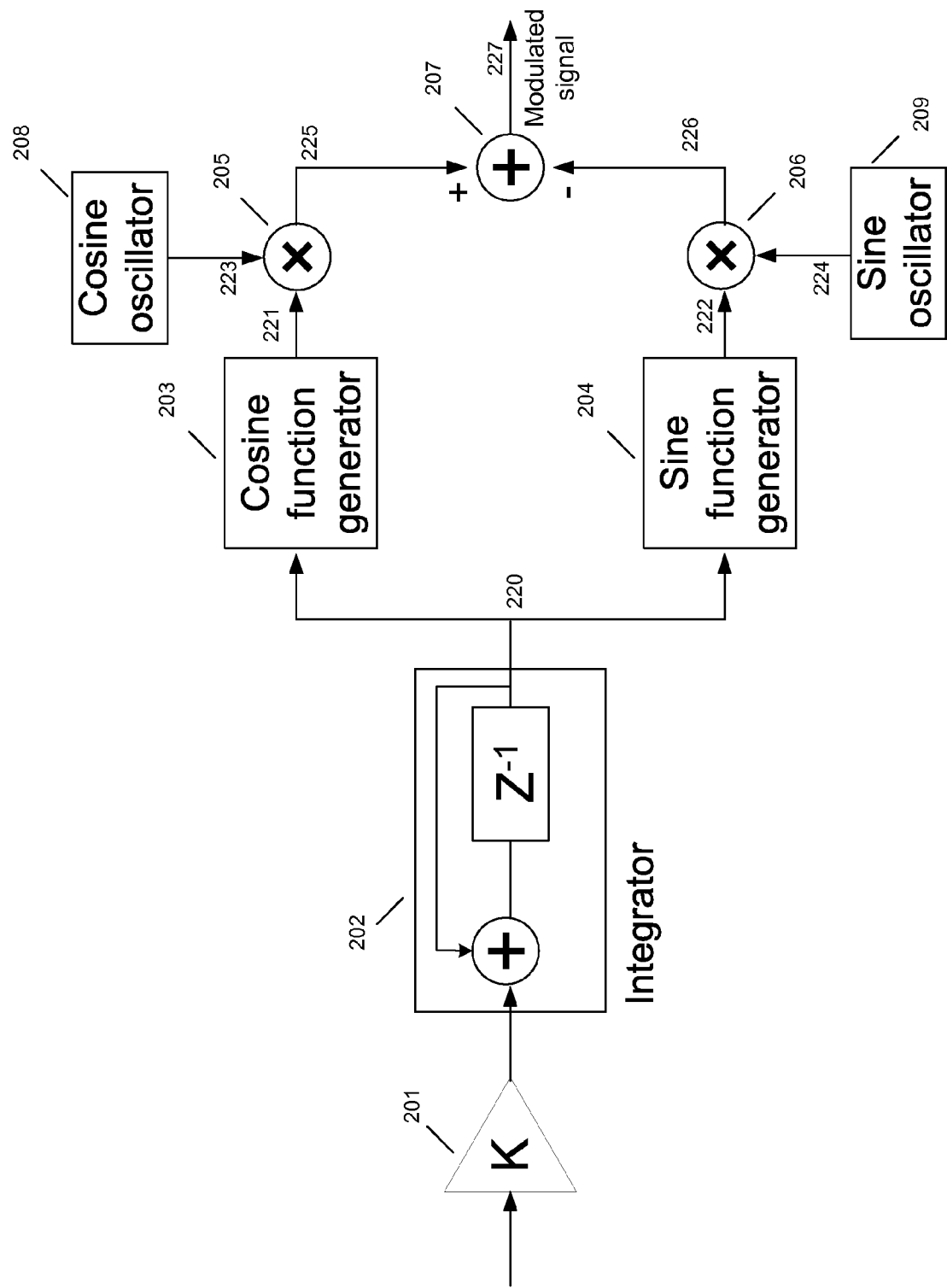
FIG. 3 is a partial block diagram illustrating an example of a digital FM modulator in accordance with an aspect of one embodiment.

FIG. 3 is a partial block diagram illustrating an example of an FM modulator. In this example, the FM modulator may contain a gain adjustment component 201 in which the gain of a message signal may be adjusted with a gain of K. The message signal may be further processed in the integrator 202. The integrator 202 may integrate the message signal which may provide for decomposition of the messaging signal into a complex signal. For example, the output 220 of the integrator 202 may be an integrated function $\Phi(t)$ determined as a function over time of the amplitude of the message signal. Also, in this example, $\Phi(t)$ may be represented as a function of the signal sample n as $\Phi(n)$ or $\Phi(n+1)$.

In addition, the FM modulator may include function generators. In the example illustrated in FIG. 3, the FM modulator contains a cosine function generator 203 and a sine function generator 204. It is noted that the cosine function generator 203 and the sine function generator 204 are merely examples and that any number of function generators of any type may be included in the FM modulator. The function generators may form a decomposing unit with the integrator 202. For example, the cosine function generator 203 and the integrator 202 may form a decomposing unit for decomposing a message signal into a cosine component of a complex signal. Also, the sine function generator 204 and the integrator 202 may form a decomposing unit for decomposing a message signal into a sine component of a complex signal.

In this example, the cosine function generator 203 and the sine function generator 204 may decompose the integrated message signal into a complex signal that may include a cosine component from the cosine function generator 203 and a sine component from the sine function generator 204. Hence, the output of the cosine function generator 203 and the output of the sine function generator 204 from the integrator 202 may provide two complex components of a complex signal based on the original signal.

The two complex components (e.g., the cosine and the sine functions) may interfere to produce an FM modulated signal. Hence, no lookup table is necessary in the present invention. For example, the output of the integrator 202 (220) may be a function of the modulated signal in terms of the number of samples processed n as $\Phi(n+1)$ and may be further processed by the cosine function generator 203. In this example, the output 221 of the cosine function generator 203 may be cos $\Phi(n+1)$. Similarly, the output 220 of integrator 202 may be processed by the sine function generator 204 with an output 222 of sin $\Phi(n+1)$.

The FM modulator illustrated in the example of FIG. 3 may further include a cosine oscillator 208 and a sine oscillator 209. The cosine oscillator 203 and the sine oscillator 209 may be AM modulators that may oscillate in quadrature. In this example, two AM modulators are illustrated, however, any number of AM modulators may be used. For example, a complex modulator may be used to remove a side band of the modulating or message signal in which additional AM modulators may be used.

In one example, the cosine oscillator 208 provides a cosine component of the modulated signal as a function of the number of samples and/or the ratio between the oscillator frequency and the sample rate of the digital modulator. For example, if the ratio between the oscillator frequency and the sample rate of the digital modulator is given as $\theta$, the sample given as n, the next sample given as (n+1) and the previous sample as (n−1), then the output 223 of the cosine oscillator 208 may be, for example, $\cos[(n+1)\theta]$ which may be further provided by the cosine oscillator 208 as $[2\cos\theta \cos(n\theta) - \cos[(n-1)\theta]]$.

Similarly, the sine oscillator 209 may provide a sine component of the modulated signal as a function of the number of samples and/or the ratio between the oscillator frequency and the sample rate of the digital modulator. For example, the output 224 of the sine oscillator 209 may be $\sin[(n+1)\theta]$ which may be further provided by the sine oscillator 209 as $[2\cos\theta \sin(n\theta) - \sin[(n-1)\theta]]$.

The output 221 of the cosine function generator 203 and the output 223 of the cosine oscillator 208 may be further processed by a multiplier 205. Hence, in this example, the output 225 of the multiplier 205 may be the product of the output of the cosine function generator 203 (in this example, equal to $\cos\Phi(n+1)$) and the output of the cosine oscillator 208 (in this example, equal to $\cos[(n+1)\theta]$). In this example, the output of the multiplier 205 (225) may be $\{\cos\Phi(n+1)\cos[(n+1)\theta]\}$.

Also, the output 222 of the sine function generator 204 and the output 224 of the sine oscillator 209 may be processed by a multiplier 206 such that the output 226 of the multiplier 206 may be the product of the output 222 of the sine function generator 204 (in this example, equal to $\sin\Phi(n+1)$) and the output 224 of the sine oscillator 209 (in this example, equal to $\sin[(n+1)\theta]$. Thus, in this example, the output 226 of the multiplier 206 may be $\{\sin\Phi(n+1)\sin[(n+1)\theta]\}$.

The FM modulator in this example may further include a subtractor 207 in which the output of multiplier 205 (225) and the output of multiplier 206 (226) may be added or subtracted to form the modulated signal 227. Hence, the modulated signal 227 may be provided by the FM modulator without phase shifting of the carrier. Also, lookup tables are not necessary in modulating of the signal.

As one example of the FM modulator, the integrator 202 and cosine function generator 203 may provide an output 221 of $\cos\Phi(n+1)$ and the integrator 202 and the sine function generator 204 may provide an output 222 of $\sin\Phi(n+1)$. Also in this example, the cosine oscillator 208, which may be an AM modulator, may provide an output 223 as follows:

$$\cos[(n+1)\theta] = 2\cos\theta \cos(n\theta) - \cos[(n-1)\theta]$$

And the sine oscillator 209, which may be an AM modulator operating in quadrature with the cosine oscillator 208 may provide an output 224 as follows:

$$\sin[(n+1)\theta] = 2\cos\theta \sin(n\theta) - \sin[(n-1)\theta]$$

The multiplier 205 may multiply the output of the cosine oscillator 223 with the output of the integrator 202 and the cosine function generator 203. In this example, the output of the multiplier 205 (225) may be expressed as follows:

$$\cos[(n+1)\theta] \cos\Phi(n+1)$$

The multiplier 206 may multiply the output of the sine oscillator 224 with the output of the integrator 202 and the sine function generator 204 (222). In this example, the output of the multiplier 206 may be given as follows:

$$\sin[(n+1)\theta] \sin\Phi(n+1)$$

Also in this example, the output of the multiplier 206 (226) may be subtracted from the output of the multiplier 205 (225) by an adder/subtractor 207. The output of the adder/subtractor 207 (227) may be the modulated signal 227 and may be expressed as follows:

$$C_m(n+1) = A\{\cos[(n+1)\theta] \cos\Phi(n+1) - \sin[(n+1)\theta] \sin\Phi(n+1)\}$$

The digital FM modulator may be implemented in hardware blocks with each component being a hardware component. In addition, the modulator may be implemented in a DSP processor such that computations performed by each component of the modulator may be performed in software.

The modulator may be implemented as a component of a processor or other component or may be implemented as a separate, dedicated hardware device or software module. The modulator may further be implemented as a dedicated hardware device and in a DSP processor or a software module. For example, a portion of the modulator may be provided in a dedicated hardware device and another portion may be provided in a DSP processor.

In an example of the present invention, a FM modulator is provided in which look up tables are not used. Because lookup tables are not used, different carrier frequencies may be conveniently used with the same hardware components.

The embodiments herein include any feature or combination of features disclosed herein either explicitly or any generalization thereof. While the invention has been described with respect to specific examples including presently preferred modes of carrying out the invention, those skilled in the art will appreciate that there are numerous variations and permutations of the above described systems and techniques.

What is claimed is:

1. A method of modulating a carrier signal in FM modulation comprising:
   integrating a message signal;
   decomposing the integrated message signal into a complex signal;
   modulating the carrier signal in a discrete time domain based on the complex signal, wherein modulating the carrier signal includes:
      determining a first function corresponding to a cosine function of a ratio between a first oscillator frequency and a sample rate of the FM modulation, and
      determining a second function corresponding to a sine function of a ratio between a second oscillator frequency and the sample rate of the FM modulation.

2. The method of claim 1 wherein the complex signal comprises a first complex component and a second complex component.

3. The method of claim 2 wherein the first complex component comprises a cosine function and the second complex component comprises a sine function.

4. The method of claim 3 wherein the first complex component interferes with the second complex component to provide a modulated signal.

5. The method of claim 1 wherein modulating the complex signal comprises operating two AM modulators in quadrature.

6. The method of claim 1 further comprising: determining a third function corresponding to a cosine function and a fourth function corresponding to a sine function.

7. The method of claim 6 wherein the third function comprises cos $\Phi(n+1)$ and the fourth function comprises sin $\Phi(n+1)$, wherein n is the number of samples and $\Phi(n+1)$ represents a phase of the carrier signal in the discrete time domain.

8. The method of claim 7 wherein the first function is cos $[(n+1)\theta]$ and the second function is sin $[(n+1)\theta]$, wherein n is the number of samples and $\theta$ is a ratio between an oscillator frequency and the sample rate of the FM modulation.

9. The method of claim 8 wherein the modulating step further comprises determining a third function corresponding to cos $\Phi(n+1)$ and a fourth function corresponding to sin $\Phi(n+1)$, wherein n is the number of samples and $\Phi(n+1)$ represents a phase of the carrier signal in a discrete time domain.

10. The method of claim 9 wherein the modulating step further comprises determining the product of the first function and the third function to obtain a fifth function and determining the product of the second function and the fourth function to obtain a sixth function.

11. The method of claim 10 wherein the fifth function comprises cos $[(n+1)\theta]$ cos $\Phi(n+1)$ and the sixth function comprises sin $[(n+1)\theta]$ sin $\Phi(n+1)$.

12. The method of claim 10 wherein the modulating step further comprises subtracting the sixth function from the fifth function.

13. A digital FM modulator for modulating a carrier signal in FM modulation comprising:
an integrator for integrating a message signal;
a decomposing unit for decomposing the integrated message signal into a complex signal, wherein the complex signal is based on a phase of the carrier signal in a discrete time domain; and
a first and second digital oscillator oscillating in quadrature for modulating the carrier signal based on the complex signal, and wherein modulating the carrier signal includes:
determining a first function corresponding to a cosine function of a ratio between a first oscillator frequency and a sample rate of the FM modulation, and
determining a second function corresponding to a sine function of a ratio between a second oscillator frequency and the sample rate of the FM modulation.

14. The modulator of claim 13 wherein the complex signal comprises at least a first and second complex component, the first and second complex components interfering.

15. The modulator of claim 13 wherein the decomposing unit comprises a third function generator and a fourth function generator.

16. The modulator of claim 15 wherein the third function generator is a cosine function generator outputting a function corresponding to cos $\Phi(n+1)$ and the fourth function generator is a sine function generator outputting a function corresponding to sin $\Phi(n+1)$.

17. The modulator of claim 13 wherein first digital oscillator is a cosine oscillator outputting a function corresponding to cos $[(n+1)\theta]$ and the second digital oscillator is a sine oscillator outputting a function corresponding to sin $[(n+1)\theta]$.

18. The modulator of claim 13 wherein the decomposing unit comprises a cosine function generator and a sine function generator, the modulator further comprising:
a first multiplier for multiplying output of the cosine function generator and the first digital oscillator, the first digital oscillator being a cosine oscillator;
a second multiplier for multiplying output of the sine function generator and the second digital oscillator, the second digital oscillator being a sine oscillator.

19. The modulator of claim 18 further comprising a subtractor for subtracting output from the second multiplier from corresponding output from the first multiplier to produce a modulated signal.

20. The method of claim 6, wherein modulating the complex signal includes multiplying the first function with a third function generated by a cosine oscillator and multiplying the second function with a fourth function generated by a sine oscillator.

21. The method of claim 20, wherein the cosine oscillator and the sine oscillator operate in quadrature.

* * * * *